(12) United States Patent
Kazemi et al.

(10) Patent No.: US 11,755,050 B2
(45) Date of Patent: Sep. 12, 2023

(54) ADAPTIVE CURRENT MIRROR CIRCUIT FOR CURRENT SHAPING WITH TEMPERATURE

(71) Applicant: Apple Inc., Cupertino, CA (US)

(72) Inventors: Mohammad Kazemi, Austin, TX (US); Michael A. Dreesen, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/467,910

(22) Filed: Sep. 7, 2021

(65) Prior Publication Data
US 2023/0074425 A1 Mar. 9, 2023

(51) Int. Cl.
*G05F 3/26* (2006.01)
*G11C 11/417* (2006.01)
*G11C 5/14* (2006.01)

(52) U.S. Cl.
CPC ............. *G05F 3/262* (2013.01); *G11C 5/147* (2013.01); *G11C 11/417* (2013.01)

(58) Field of Classification Search
CPC ....... G11C 5/147; G11C 11/413; G11C 11/417
See application file for complete search history.

(56) References Cited

U.S. PATENT DOCUMENTS

| | | | |
|---|---|---|---|
| 7,265,628 B2 | 9/2007 | Lloyd et al. | |
| 8,525,582 B2 | 9/2013 | Matsubara | |
| 8,669,808 B2 * | 3/2014 | Liu | G05F 3/242 327/540 |
| 8,897,727 B2 * | 11/2014 | Wang | G01R 29/0871 455/226.1 |
| 9,719,861 B2 * | 8/2017 | Ramaraju | G01K 7/01 |
| 10,754,369 B2 | 8/2020 | Nomura et al. | |

\* cited by examiner

*Primary Examiner* — Kretelia Graham
(74) *Attorney, Agent, or Firm* — Kowert, Hood, Munyon, Rankin & Goetzel, P.C.; Erik A. Heter; Dean M. Munyon

(57) ABSTRACT

An adaptive current mirror circuit for current shaping with temperature is disclosed. The adaptive current mirror includes a current generator circuit configured to receive and input current and generate an output current using the input current and an overdrive voltage. The adaptive current mirror further includes a compensation circuit configured to adjust a value of the overdrive voltage based on temperature.

21 Claims, 12 Drawing Sheets

ADAPTIVE CURRENT MIRROR CIRCUIT FOR CURRENT SHAPING WITH TEMPERATURE

BACKGROUND

Technical Field

This disclosure is directed to electronic circuits, and more particularly, to current mirror circuits.

Description of the Related Art

Current mirror circuits are widely used in modern electronics. A current mirror circuit is a circuit designed to copy a current through an input device in order control a current through an output device. The current mirror may be designed such that the input device controls the current through the output device such that the latter remains substantially constant despite any loading on the circuit.

Some current mirrors may be implemented using, e.g., NMOS devices. An input device may be implemented with a diode-coupled NMOS device. Respective gate terminals of the input and output devices are coupled to one another in such an embodiment. The current through the input device, the input current, is "mirrored" such that there is a steady relationship between the input current and the current through the output device (the output current). It is noted that the output current does not necessarily have the same value as the input current. Instead, the input and output currents may be related by some ratio that may depend on characteristics (e.g., sizes) of the devices used to implement the current mirror.

SUMMARY

An adaptive current mirror circuit for current shaping with temperature is disclosed. In one embodiment, the adaptive current mirror includes a current generator circuit configured to receive and input current and generate an output current using the input current and an overdrive voltage. The adaptive current mirror further includes a compensation circuit configured to adjust a value of the overdrive voltage based on temperature.

In various embodiments, the current generator circuit may be implemented using a current mirror circuit having, e.g., a diode-coupled input device and another device referred to as an output device. The current mirror circuit is configured to receive an input current and further configured to generate the output current based on the overdrive voltage The compensation circuit may be implemented using at least one device pair coupled to the diode-coupled device. The compensation circuit is configured to adjust a conductance of an output device of the current mirror by adjusting an overdrive voltage. For example, if the circuit is implemented using various types of MOSFET devices (e.g., NMOS transistors), a device pair of the compensation circuit may include first and second devices of the same or similar type. A first device of a device pair may include a gate terminal coupled to the diode-coupled device. A second device of the device pair includes gate and drain terminals coupled to a source terminal of the diode-coupled device. Depending on the characteristics of the devices used to implement the circuit, the overdrive voltage on the output device (e.g., its gate voltage minus its threshold voltage) may be controlled in such a manner that a desired relationship between temperature and the output current is achieved.

A compensation circuit implementing only a single device pair may be referred to as a first-order compensation circuit. The disclosure contemplates compensation circuits that of an Nth order, in which N device pairs are implemented. Applying an Nth order compensation circuit to the example of the previous paragraph, a first device of each pair may have a gate terminal coupled to the gate terminal of the diode-coupled device, while the second device may have gate and drain terminals coupled to the source terminal of the diode-coupled device.

BRIEF DESCRIPTION OF THE DRAWINGS

The following detailed description makes reference to the accompanying drawings, which are now briefly described.

DETAILED DESCRIPTION OF EMBODIMENTS

Figure 1:
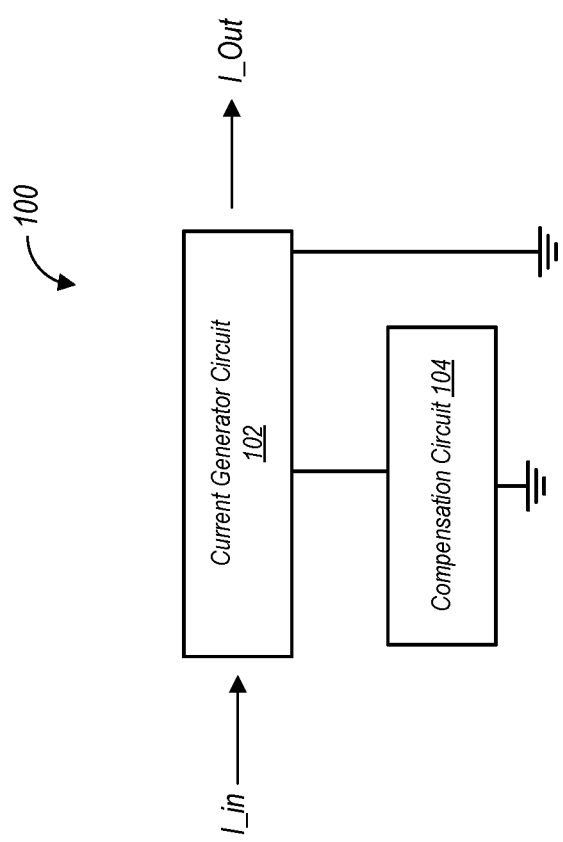
FIG. 1 is a block diagram of one embodiment of a circuit configured to control a relationship between an input current and an output current with regard to temperature.

The present disclosure is directed to circuitry to implement an adaptive current mirror. Current mirror circuits are well-known in the electronic arts and have a wide variety of applications. However, it is often times difficult to control the response of a current mirror with variations in temperature. The present disclosure contemplates a compensation circuit to be used in conjunction with a current mirror to shape the circuit's response over a range of temperatures. By varying the design of the compensation circuit, the relationship between temperature and the current output by the current mirror can be set to a desired relationship.

In various embodiments, a compensation circuit can be implemented to cause the current to increase with temperature, decrease with temperature, remain flat over a range of temperatures, and so on. This may be accomplished through selection of the characteristics of devices used to implement the compensation circuit and the current mirror itself. As a result of the ability to control the relationship between temperature and current, the current mirror with a compensation circuit (which may collectively be referred to as an adaptive current mirror) may be used as a temperature sensor, a biasing circuit, and/or a current reference, among other possible applications. The various ways the relationship between temperature and current can be shaped will be discussed in further detail below.

In various embodiments, the adaptive current mirror includes a current generator circuit and a compensation circuit. The current generator circuit may be implemented using current mirror circuitry having a pair of devices coupled to one another at respective gate terminals, with one of the devices being a diode-coupled device. The compensation circuit may include one or more device pairs coupled to, e.g., source and drain terminals of the diode-coupled device. Generally speaking, there may be N pairs of devices in the compensation circuit, and the compensation circuit may thus be considered an Nth order circuit. By controlling both the order of the compensation circuit and the characteristics of the device with which it is implemented, a desired shape of a current vs. temperature profile may be achieved.

The discussion below will now be presented as follows. A basic block diagram of an embodiment of an adaptive current mirror circuit is discussed. Thereafter, descriptions are provided for a number of different embodiments of an adaptive current mirror circuit with varying order. A description of a schematic diagram for one particular application of an embodiment of an adaptive converter follows. Thereafter, the discussion continues with reference to various different types of current vs. temperature profiles that may be achieved in various embodiments, and applications for various embodiments of an adaptive current mirror. The description continues with a number of additional example applications. A method flow diagram describing operation of an adaptive current mirror and an example system in which circuits described herein may be used conclude the description.

Adaptive Current Mirror:

FIG. 1 is a block diagram of one embodiment of an adaptive current mirror circuit. In the embodiment shown, the adaptive current mirror circuit 100 includes a current generator circuit 102 and a compensation circuit 104. The current generator circuit 102 is configured to receive a first current I_in, and generate a second, output current, I_Out. In various embodiments, the current generator circuit may be a current mirror circuit implemented with, e.g., transistors, including a diode-coupled device though which the input current is received and another device through which the output current is provided. The output current is generated using the input current and an overdrive voltage, which is a difference between a gate voltage and a threshold voltage of an output device through which the output current is generated. Since the gate terminals of an input device and the output device are coupled to one another, the output current "mirrors" the input current, with changes between these two currents being substantially proportional to one another.

Adaptive current mirror circuit 100 also includes a compensation circuit 104. The compensation circuit 104 may provide compensation to control the response of current generator circuit 102 with respect to a temperature of the circuit. More particularly, the compensation circuit 104 may be used to shape a current vs. temperature profile across a range of temperatures, with the current varying with temperature in some desired manner. For example, compensation circuit 102 may be designed to cause the output current generated by current generator 102 to increase linearly with temperature in one embodiment. In another embodiment, compensation circuit 102 may be designed to cause the output current to decrease as temperature increases. In yet another embodiment, compensation circuit 102 may be designed such that the output current is independent of temperature. Other current vs. temperature profiles are possible and contemplated and will be discussed in further detail below.

Obtaining a desired relationship between temperature and current may be accomplished by various mechanisms. One aspect of obtaining the desired temperature-current relationship pertains to the order of the compensation circuit. The compensation circuit may have a basic circuit structure, and this structure may be repeated. If one instance of the circuit structure is present, the compensation circuit is referred to as a first order compensation circuit. If a second instance of the circuit structure is present, the circuit is referred to as a second order compensation circuit. In general, the compensation circuit is an Nth-order compensation circuit, with N instances of the circuit structure.

The temperature-current relationship can also be controlled through the selection of various parameters of the devices implementing the compensation circuit 102. In transistor-based embodiments, the relationship between temperature and a transistor's threshold voltage may be exploited to achieve the desired shape of the current vs. temperature profile. More particularly, the relative sizes of the devices used to implement both the current generator circuit 102 and the compensation circuit 104 may be selected in a manner to control the overdrive voltage as temperature changes.

Accordingly, various embodiments of compensation circuit 104 may be designed to select both an order of the circuit as well as respective sizes of the devices implemented therein in order to achieve the desired shape of the current vs. temperature profile. This in turn may allow a designer a significant amount of flexibility to achieve a variety of different implementations, and thus applications, of the adaptive current mirror circuit disclosed herein.

Adaptive Current Mirror Examples

Figure 2:
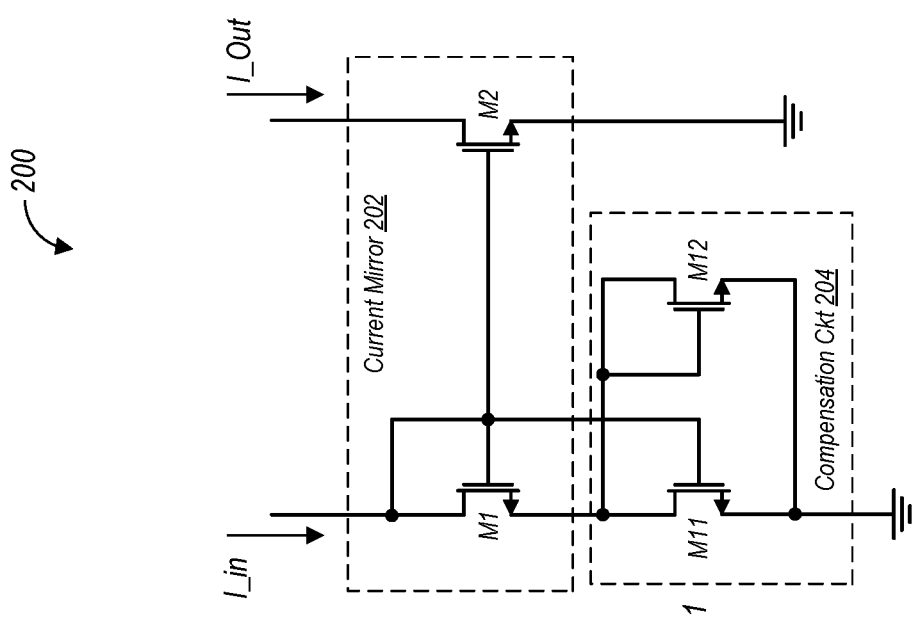
FIG. 2 is a schematic diagram of one embodiment of an adaptive current mirror circuit having a compensation circuit.

FIG. 2 is a schematic diagram of one embodiment of an adaptive current mirror circuit. In the embodiment shown, adaptive current mirror 200 includes a current mirror 202 and a compensation circuit 204. In this particular example, both current mirror 202 and compensation circuit 204 are implemented using NMOS transistors, although embodiments implemented using other types of devices are possible and contemplated.

Current mirror 202 in the embodiment shown includes a first device, M1, and a second device, M2. Device M1 in this example is a diode-coupled device, having its respective gate and drain terminals coupled to one another. Furthermore, the gate terminal of M1 is coupled to that of M2. The input current to current mirror 202 passes through the drain-source path of M1, as well as through the node coupling the gate and drain terminals of this device. This input current, I_in, is mirrored through device M2. The output current is generated by M2, passing through its drain-source path. Device M2 generates the output current based on an overdrive voltage on its gate terminal, the overdrive voltage being a function of the input current.

Compensation circuit 204 in the embodiment shown also includes a pair of devices, M11 and M12. The gate terminal of M11 is electrically connected to the gate terminal of M1. The gate and drain terminals of M12 are electrically connected to the source terminal of M1, as is the drain terminal of M11. The source terminals of M11 and M12 are both coupled to ground in this embodiment. As compensation circuit 204 includes only a single pair of devices, adaptive current mirror is considered to be a first order adaptive current mirror for the purposes of this disclosure.

In the first order adaptive current mirror as shown in FIG. 2, the input current I_in flows primarily through M11 at low temperatures. As the temperature of the circuit increases, the threshold voltages of the devices decreases. Accordingly, the shunt device M12 passes more current. This results in a smaller effective resistance seen at the source node of M1, and correspondingly, a decrease in the gate voltage of M2. The reduction of the gate voltage of M2 may depend on the relative size of itself, M11, and M12. The overdrive voltage of M2 may be defined as $V\_od=V\_g-V\_th$, or the difference between the device's gate and threshold voltages. This overdrive voltage may increase or decrease with temperature (again, depending on the relative device sizes), and thus lead to an ascending or descending output current over a specific range of temperatures.

Figure 3:
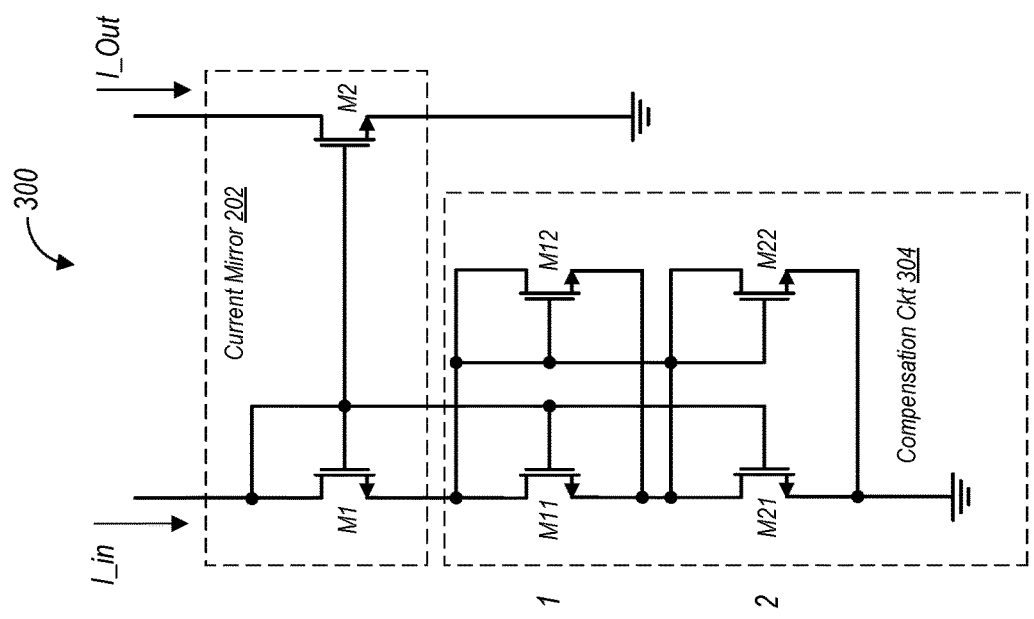
FIG. 3 is a schematic diagram of another embodiment of an adaptive current mirror circuit having a compensation circuit.

FIG. 3 is a schematic diagram of another embodiment of an adaptive current mirror circuit. In this example, a second-order adaptive current mirror circuit 300 is illustrated, with compensation circuit 304 having two device pairs. Current mirror 202 in the embodiment shown is arranged similarly to that of FIG. 2, although the device sizes and other parameters may be different.

Compensation circuit 304 in the embodiment shown includes a first device pair comprising M11 and M12, and a second device pair comprising M21 and M22. The first device pair is coupled to M1 as in the previously discussed embodiment. With respect to the second device pair, the gate terminal of M21 is electrically connected to corresponding gate terminals of M11 and M1. The gate terminal of M22 is electrically connected to the gate terminal of M12, and is also electrically connected to the source terminals of M1 and M11. The source terminals of M11 and M12 are electrically connected to the drain terminal of M21.

As with the previous embodiment, variation of the relative device sizes can be used to shape the profile of current vs. temperature in adaptive current mirror 300. For example, M22 and M12 may be sized differently so that the threshold voltage of one of these devices falls faster as temperature increases relative to the threshold voltage of the other device. Devices M11 and M21 may be similarly varied, and any of the devices in compensation circuit 304 may be sized differently from that of M1 and/or M2.

Generally speaking, by controlling the sizes of the devices in a given embodiment of a compensation circuit, the relative rates of decline of their respective threshold voltages as temperature increases can be varied. This allows for a greater degree of control of the overdrive voltage on the gate of M2, and thus, control of the output current, I_out, with respect to temperature. Adding additional orders (by adding additional device pairs) allows for more fine tuning of the response of the circuit to variations in temperature, and thus allows for more ability to shape the response over a range of temperatures.

Figure 4:
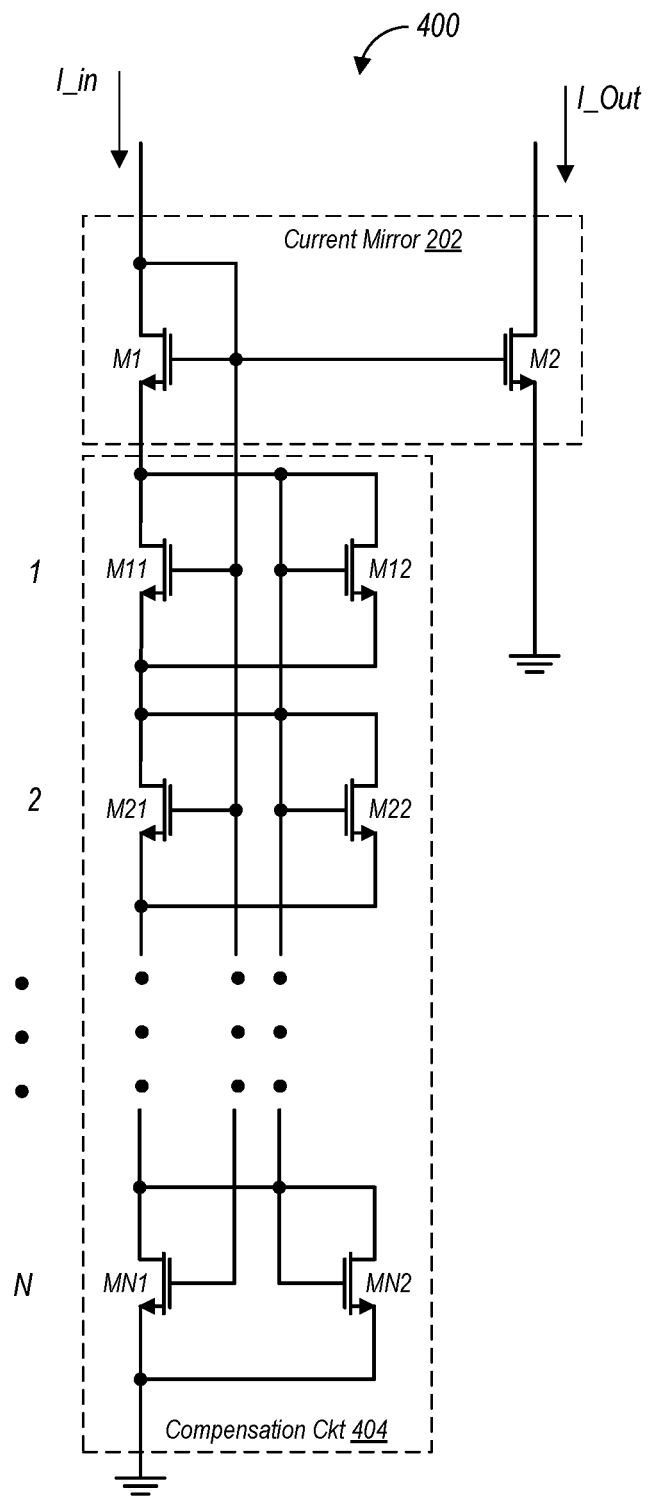
FIG. 4 is a schematic diagram of another embodiment of an adaptive current mirror circuit having a compensation circuit.

FIG. 4 illustrates another embodiment of an adaptive current mirror 400. In this example, adaptive current mirror 400 is generalized as an Nth order adaptive current mirror, having N device pairs in compensation circuit 404. Generally speaking, N can be any value, including a value of N=1 (as in the embodiment of FIG. 2) and N=2 (as in FIG. 3). In FIG. 4, N>2, although in the general case, N>=1.

For each of the device pairs of compensation circuit 404, the left-hand side devices (M11, M21 . . . MN1) are electrically coupled in series between the source terminal of M1 and a ground node. The gate terminals of each of the left-hand side devices are coupled to one another and to the gate terminal of M1 of current mirror 202.

With respect to the right-hand side devices (which may be referred to as shunt devices) of compensation circuit 404 (M12, M22 . . . MN2), the respective gate terminals of each are electrically connected to one another and to the source terminal of M1 in current mirror 202. The source terminal of each of the right-hand side devices is electrically connected to the source terminal of its counterpart left-hand device. Thus, the source terminal of M12 is electrically connected to the source terminal of M11, the source terminal of M22 is electrically connected to the source terminal of M21, and the source of MN2 is electrically connected to the source terminal of MN1. Similarly, the drain terminals of each of the right-hand devices are electrically connected to the respective drain terminals of their respective left-hand devices (e.g., the drain terminal of M22 is electrically connected to the drain terminal of M21). Furthermore, for each of the right-hand side devices, their respective drain terminal is electrically connected to its respective gate terminal.

The implementation of higher-order adaptive current mirror circuits may allow for even greater flexibility in shaping the current vs. temperature profile, as there is a greater number of devices for which the sizes may be adjusted. Since adjusting the sizes of individual devices affects how their respective threshold voltage changes with temperature, the greater number of devices allows for more granularity in shaping the desired temperature response of the circuit.

Figure 5:
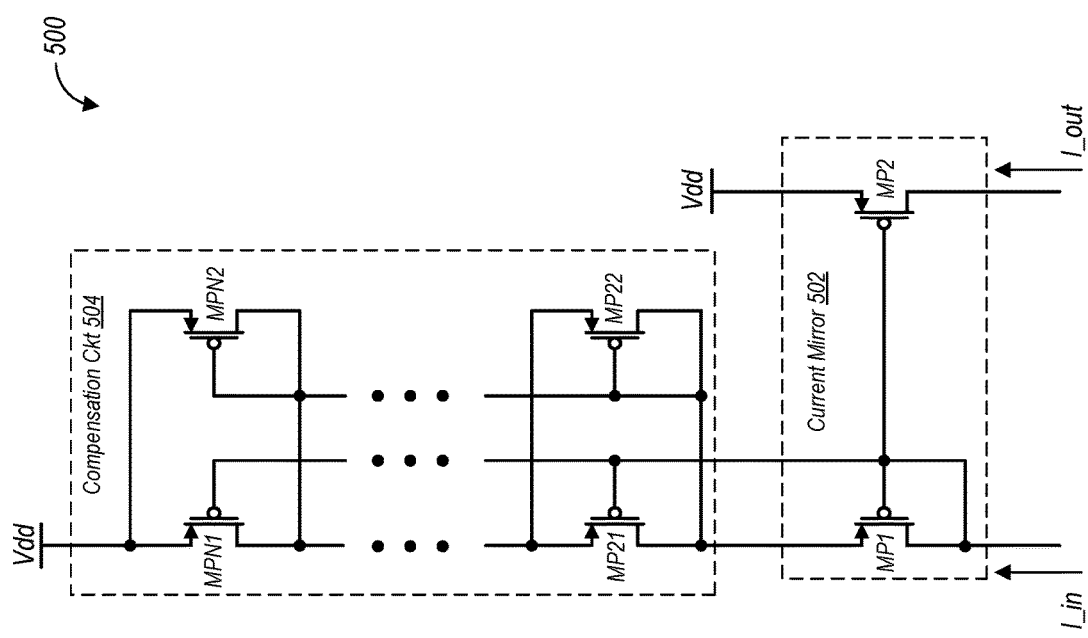
FIG. 5 is a schematic diagram of another embodiment of an adaptive current mirror circuit having a compensation circuit.

FIG. 5 is a schematic diagram of another embodiment of an adaptive current mirror circuit. In this embodiment, adaptive current mirror circuit 500 is implemented using PMOS transistors rather than the NMOS transistors used to implement the embodiments of FIGS. 2-4. Adaptive current mirror circuit 500 includes current mirror 502 and compensation circuit 504. Current mirror 502 is implemented using transistors MP1 and MP2, with the former device mirroring the input current, I_in, to the latter device. Device MP2 generates the output current, I_out.

Compensation circuit 504 in the embodiment shown is an Nth order circuit, including a first transistor pair MP21 and MP22 and an Nth transistor pair MPN1 and MPN2. As with the embodiments discussed above, N can be any number N>=1. The electrical connections in terms of terminals are largely the same for the illustrated embodiment as for the previously discussed Nth order embodiments, with these connections arranged for PMOS devices. The source terminal of the devices of the Nth pair are coupled to a voltage source node, Vdd.

The operational principles of adaptive current mirror 500 are largely the same as those embodiments previously discussed. As with those embodiments, the sizing of the devices, and thus the relationship between respective threshold voltages and temperature may be exploited to tune the current vs. temperature profile as desired. Thus, the current vs. temperature profile of adaptive current mirror 500 may be set to one of the various profiles to be discussed below in reference to FIG. 7A, including ones in which output current rises with temperature, falls with temperature, and/or stays constant over a range of temperatures.

Figure 6:
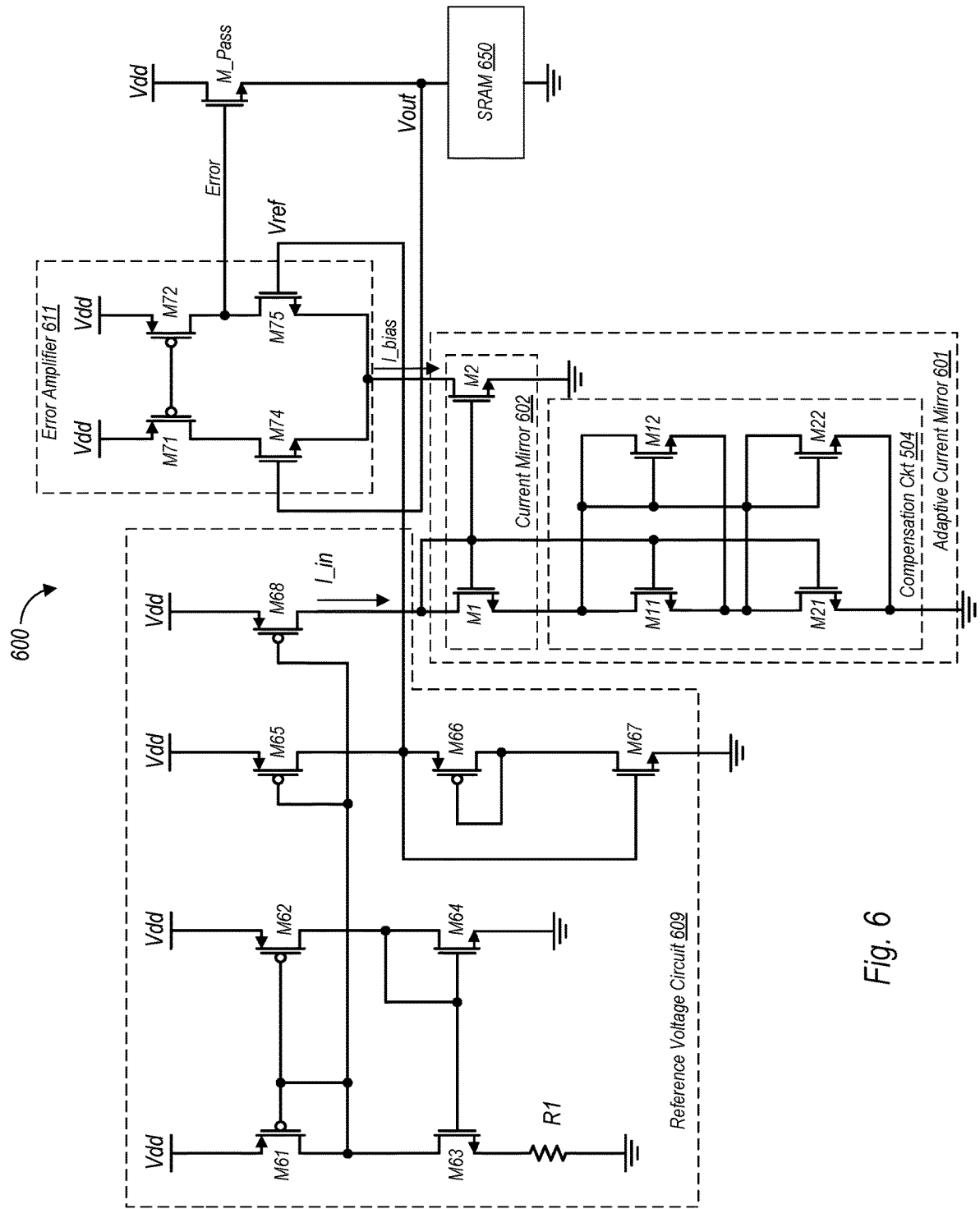
FIG. 6 is a schematic diagram of one embodiment of a voltage regulator coupled to provide a retention voltage to a static random access memory (SRAM).

Adaptive Current Mirror used to Maintain Bias Current for SRAM Retention LDO:

FIG. 6 is a schematic diagram illustrating one embodiment of an application of an adaptive current mirror circuit. In the embodiment shown, circuit 600 includes adaptive current mirror circuit 601, which is a second order circuit, and is configured to generate a bias current, I_bias, for error amplifier 611 of a low dropout (LDO) voltage regulator arrange to provide a regulated retention voltage, Vout, for SRAM 650. SRAM 650 in the embodiment shown includes a plurality of storage cells configured to store information. The LDO voltage regulator, in addition to error amplifier 611, also includes a reference voltage generation circuit 609, and a pass transistor, M_Pass. During operation in at least a retention mode, the LDO voltage regulator provides a retention voltage to the plurality of storage cells of SRAM 650 to allow it to maintain the information stored there. Adaptive current mirror 601 in the embodiment shown may adjust the bias current I_bias according to the temperature of the circuit shown in FIG. 6, including the cells of the SRAM 650.

Current mirror 602 of adaptive current mirror circuit 601 is electrically connected to transistor M68 of reference voltage circuit 609, which provides a source for the input current, I_in. This input current is a function of leakage current tracked from an array of cells in SRAM 650. Accordingly, I_in in this example increases exponentially with temperature. The bias current I_bias is used to maintain stability of the LDO voltage regulate at higher temperatures. However, if left unchecked, a larger I_bias would dissipate a significantly greater amount of power.

Using adaptive current mirror 601, a mechanism is provided to reduce power dissipation while maintaining stability of the LDO voltage regulator. More particularly, the presence of adaptive current mirror 601 makes the temperature dependence of I_bias controllable such that I_bias is significantly increased only when stability degrades. In a particular temperature range, adaptive current mirror 601 may keep I_bias substantially constant over a range of temperatures. After the temperature exceeds an upper temperature threshold, adaptive current mirror 601 provides higher values of I_bias. Conversely, when temperatures fall below a lower temperature threshold, adaptive current mirror 601 may significantly decrease the bias current, as smaller bias currents are sufficient to maintain LDO stability as lower temperatures. The ability to shape the relationship between I_bias and temperature is enabled by the presence of compensation circuit 604, the devices of which may be sized to achieve the desired temperature profile.

It is noted that while the circuits discussed above have been implemented using NMOS and PMOS transistors, the disclosure is not intended to limit embodiments falling within its scope to these types of devices. Thus, in addition to various MOSFET types discussed above, the present disclosure also contemplates embodiments that use non-planar devices such as FinFETs, GAAFETs (Gate All Around FETs), among other types.

Embodiments implemented using Bipolar devices are also possible and contemplated. The disclosure further contemplates that technologies that are speculative as of this writing may be used to implement devices in various embodiments of the circuits discussed herein. These technologies include (but are not limited to) graphene transistors, carbon nanotube transistors, gallium arsenide transistors, and so on.

Figure 7B:
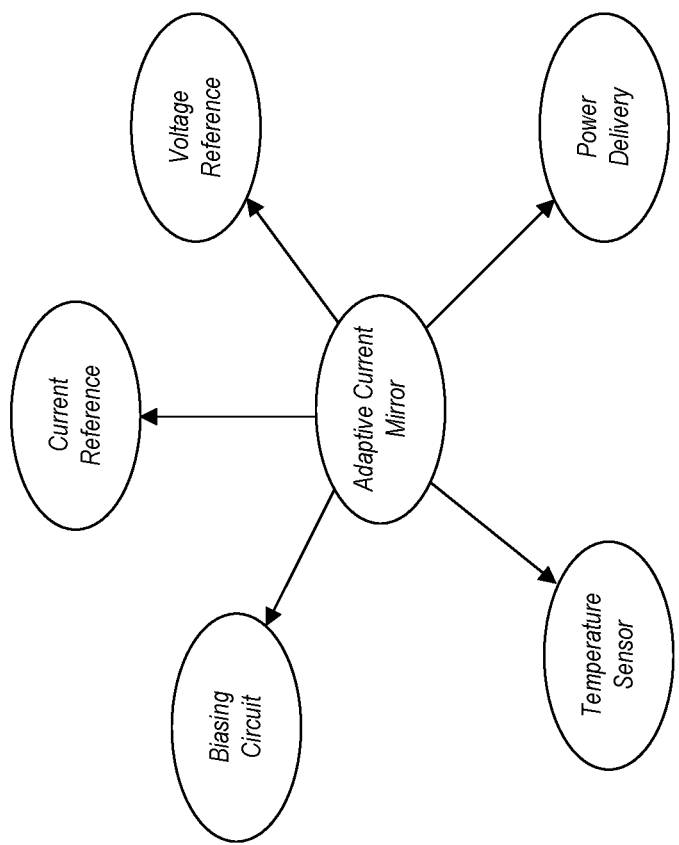
FIG. 7B is a diagram illustrating various application of an adaptive current mirror circuit.
Figure 7A:
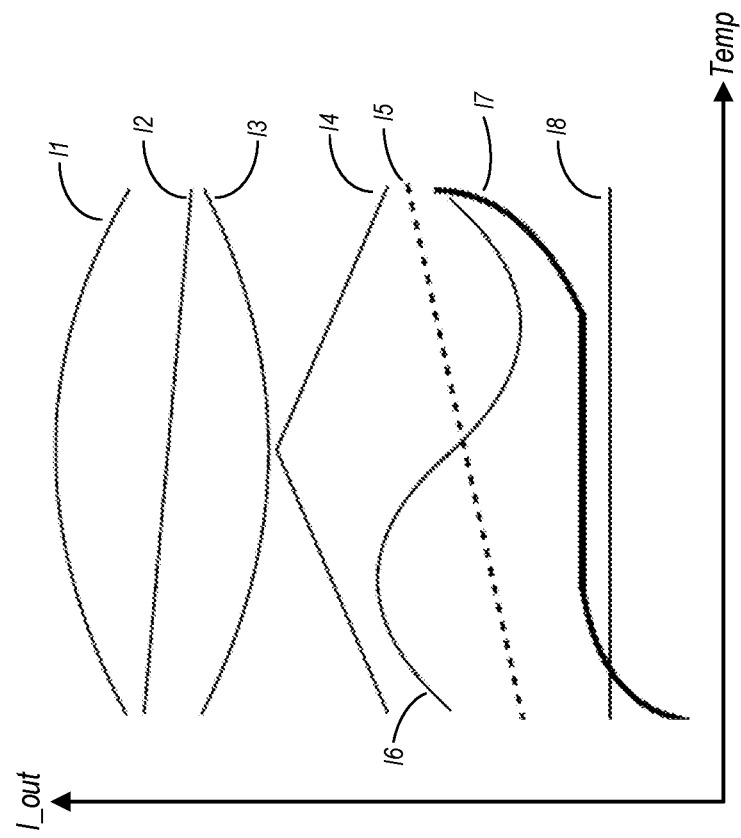
FIG. 7A is a graph illustrating various profiles of current vs. temperature for different embodiments of an adaptive current mirror circuit.

Current Profiles and Applications of the Adaptive Current Mirror Circuit:

FIG. 7A illustrates a number of different possible current vs. temperature profiles that may be achieved using various embodiments of the adaptive current mirror circuit disclosed herein. In the example shown, there are eight different current vs. temperature profiles. It is noted however that the examples shown here are not intended to be limiting, and other profiles are possible and contemplated.

Profile I1 as shown in FIG. 7A is a concave current profile, with the output current rising at a declining rate and then falling at a decreasing rate to form a concave shape over a range of temperatures. In Profile I2, the output current falls at a substantially steady rate as temperature rises. Profile I3 in the embodiment shown has a shape that is the inverse of that of Profile I1, namely an inverse concave shape. As temperature increases, the output current in Profile I3 falls at a declining rate and then climbs at an increasing rate.

In Profile I4, the current profile has a triangular shape. As temperature increases, the output current rises at a substantially linear rate until hitting an inflection point, and thereafter falls at a substantially linear rate. Profile I5 is one in which the output current rises at a substantially linear rate as temperature increases. Profile I6 shows a sinusoidal shape with respect to current vs. temperature, with the current changing in the illustrated manner as temperature increases.

Profile I7 is one in which the output current, at lower temperatures, increases asymptotically as temperature increases. Eventually, the profile flattens out for a range of temperatures, with the output current remaining substantially steady as temperature rises in this range. Above the endpoint of this range, the output current begins to rise exponentially as temperature increases. It is noted that this current vs. temperature profile may correspond to that of the adaptive current mirror 601 in the application shown in FIG. 6. Current vs. temperature profiles in which the output current remains substantially the same as temperature increases, as in Profile I8, are also possible and contemplated.

FIG. 7B is a diagram illustrating some example applications of various embodiments of an adaptive current mirror as disclosed herein. Embodiments of an adaptive current mirror may be designed for any of the various applications shown here. However, these example embodiments are not intended to be limiting, and thus, a wide variety of other applications of an adaptive current mirror in accordance with this disclosure are possible and contemplated.

In one embodiment, an adaptive current mirror may be implemented as a biasing circuit. An example of one such embodiment is shown in FIG. 6 and discussed above. Generally speaking, bias current circuits are widely used in various applications, and the present disclosure contemplates implementing these using an adaptive current mirror as discussed herein.

An embodiment of an adaptive current mirror as disclosed herein may be used to implement a temperature sensor. For example, an embodiment of an adaptive current mirror having an output current that changes linearly with temperature may be particularly well suited for use as a temperature sensor.

An adaptive current mirror in accordance with this disclosure may also be used in power delivery applications. Many types of power delivery circuits utilize current mirrors. Since the characteristics of these circuits may change with temperature, the use of an adaptive current mirror in accordance with this disclosure may be used to control the temperature response of such a circuit.

A voltage reference is another example application of the adaptive current mirror circuit according to this disclosure. An embodiment of an adaptive current mirror may generate a desired output current at a particular temperature, with the output current used to generate a corresponding voltage. In applications where a particular voltage is desired at a certain temperature, the adaptive current mirror of the present disclosure may be utilized.

Current mirror circuits are often used to generate reference currents. The adaptive current mirror circuit of the present disclosure may be suited for many such applications, particularly when it is desired to control the reference current with changes in temperature. For example, where it is desirable to provide a constant reference current over a wide range of temperatures, an embodiment of the adaptive current mirror of this disclosure may be used.

Additional Example Use Cases

Figure 8:
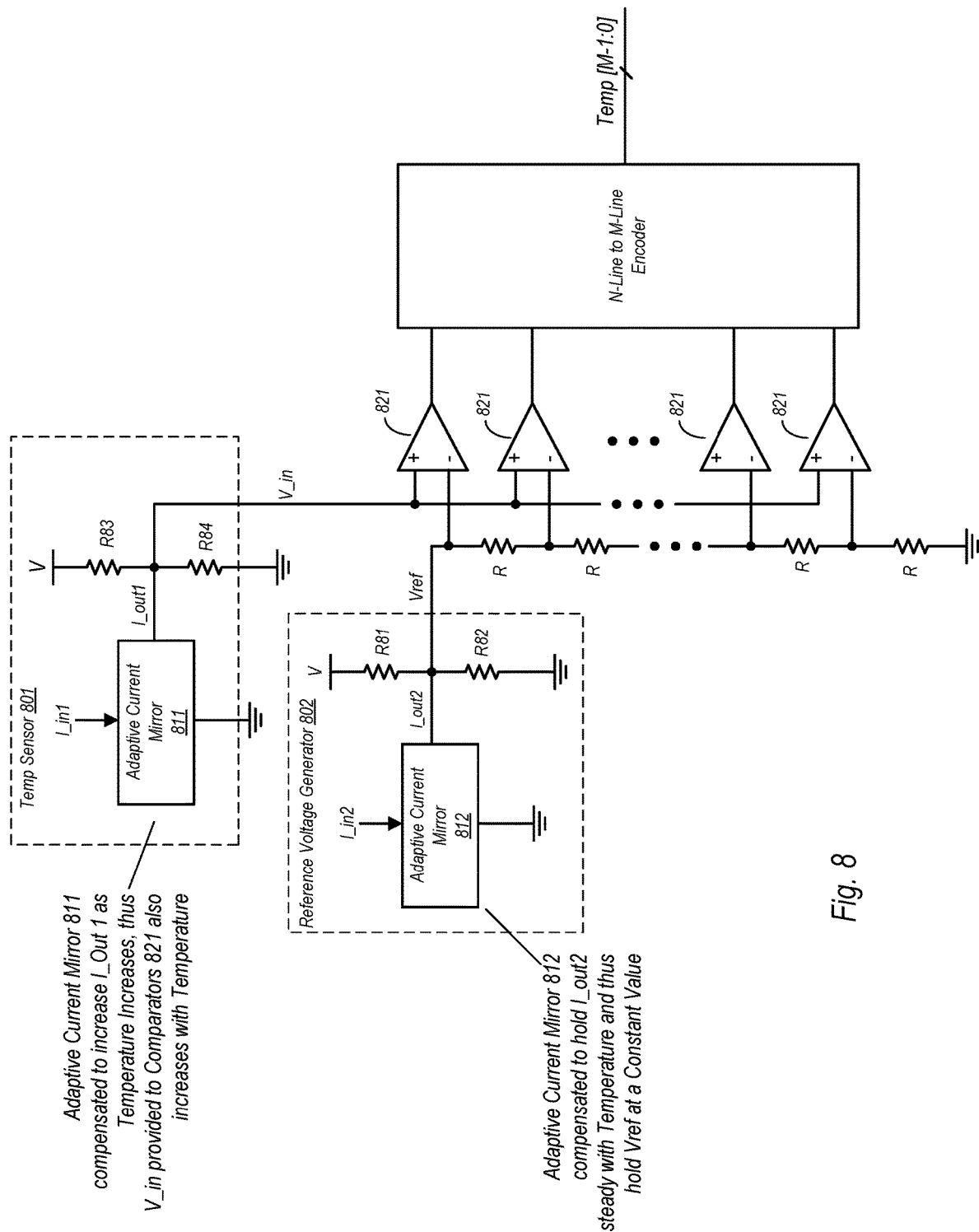
FIG. 8 is diagram of one embodiment of a temperature sensing system utilizing adaptive current mirrors.

FIG. 8 is a diagram illustrating a temperature sensing system that utilizes multiple instances of an adaptive current mirror. In the embodiment shown, adaptive current mirror 811 and adaptive current mirror 812 perform different functions with respect to one another, and may thus have different profiles with regard to current vs. temperature.

In the embodiment shown, adaptive current mirror 811 is implemented as part of temperature sensor 801. Adaptive current mirror 811 is configured to receive an input current, I_in1 (e.g., from a supply node, or some other source), and generate a corresponding output current, I_out1. The compensation circuit of adaptive current mirror 811 may vary its output current with temperature. In this particular example, the current vs. temperature profile may be similar to that of 15 shown in FIG. 7A. Thus, the output current I_out may increase as temperature increases. The output current node of adaptive current mirror is coupled to a resistive voltage divider, coupled between a voltage supply V and ground, and that includes a first resistor R83 and a second resistor R84. The voltage divider converts the current, I_out, into a voltage V_in, that is proportional to temperature. This voltage is provided to non-inverting inputs of a number of different comparators 821.

Adaptive current mirror 812 in the embodiment shown is implemented in a reference voltage generator 802. An input current, I_in2 is provided to adaptive current mirror 812, which generates a corresponding output current I_out2. In this instance, adaptive current mirror 812 is compensated to cause the output current, I_out2, to remain substantially constant with temperature, having a current vs. temperature profile similar to that of 18 shown in FIG. 7A. A second voltage divider that includes resistors R81 and R82 is coupled to convert the output current I_out2 into a reference voltage, Vref. The reference voltage, Vref, is provided to a resistor ladder having a number of series-coupled resistors R, each of which has substantially the same value. This results in a number of comparison voltages being provided on the inverting inputs of the comparators 821.

The comparators 821 in the embodiment shown compare their respectively received comparison voltages to the received input voltages, with each of the comparators producing a corresponding output signal (e.g., high or low) based on respectively performed comparisons. These signals are received by an N-line to M-line encoder, which converts the aggregate of the received signals into a digital value, Temp[M−1:0], representative of the sensed temperature.

Thus, FIG. 8 illustrates two possible applications of the adaptive current mirror disclosed herein, the sensing of a temperature and the generation of a reference voltage. This may allow, for example, the substitution of an adaptive current mirror for temperature sensing as opposed to other types of temperature sensors (e.g., ΔVbe sensors using bipolar transistors), as well as substitution of an adaptive current mirror as part of a reference voltage generation circuit (e.g., in lieu of a bandgap-type reference voltage generation circuit).

Figure 9:
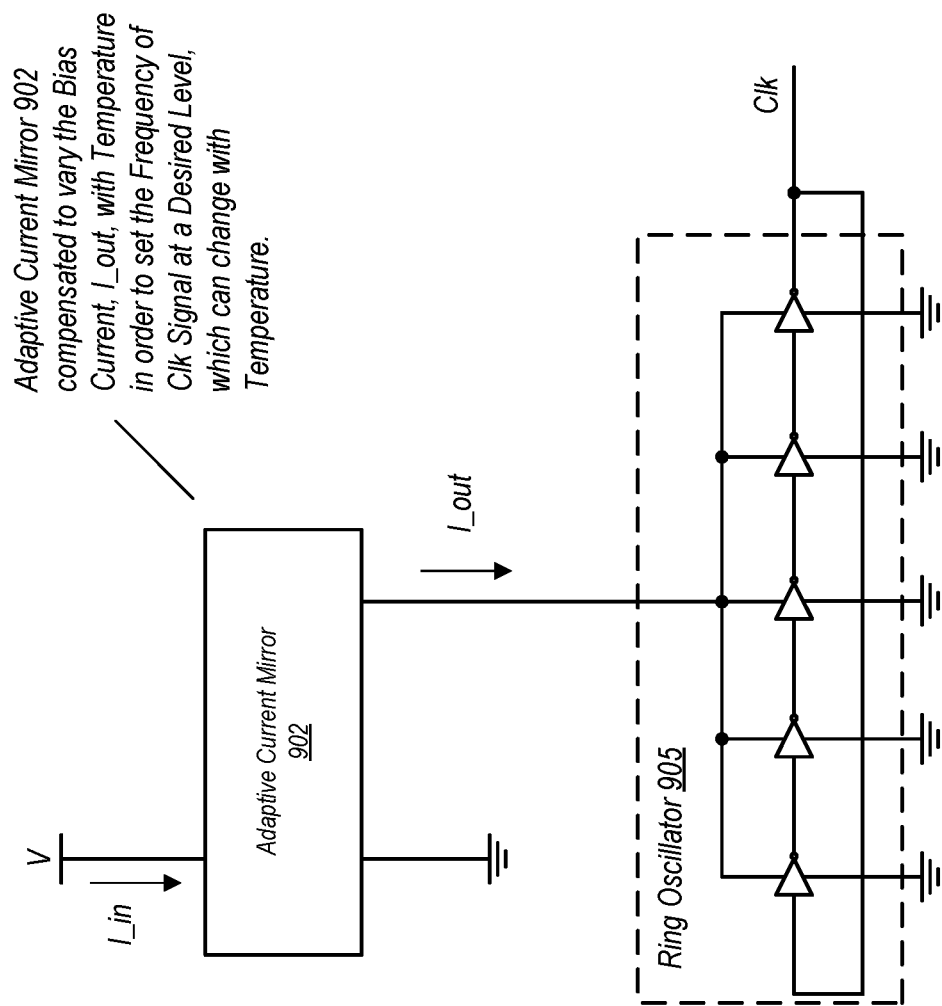
FIG. 9 is a diagram of a clock circuit utilizing an adaptive current mirror to provide a bias current.

FIG. 9 illustrates another possible use of an adaptive current mirror circuit in accordance with this disclosure. In the example shown, ring oscillator circuit 905 is configured to generate a clock signal, Clk. It is known that temperature can affect the propagation delay of signals through various logic circuits, including the inverters of ring oscillator 905. More particularly, the propagation delay may increase with temperature, which in turn can cause a reduction in the frequency of the clock signal. If it is desirable to keep the frequency substantially constant over a range of temperatures, adaptive current mirror 902 may be configured to compensate for the temperature effects on ring oscillator 905. For example, adaptive current mirror 902 may be configured such that its output current, I_out, increases with temperature, thereby compensating for the effects of rising temperature on the frequency of the clock signal. As such, a current vs. temperature profile corresponding to IS of FIG. 7A could be implemented in adaptive current mirror 902.

In another possible use case in the illustrated example, adaptive current mirror 902 may be used to alleviate the effects of a rising temperatures of ring oscillator 905 and surrounding circuits. For example, a current profile in which adaptive current mirror 902 provides temperature compensation to keep the frequency of the clock signal steady up to a temperature threshold could be implemented. Above this threshold, adaptive current mirror 902 could be arranged to cause the frequency of the clock signal produced by ring oscillator 905 to decrease as temperature increases. The reduced frequency of the clock signal may in turn reduce switching activity in the clock consumer circuits that receive the clock signal. The reduction in switching activity can eventually result in lower temperatures.

The operation of the previous paragraph may be accomplished by an implementation of adaptive current mirror 902 having a current vs. temperature profile such as 14 in FIG. 7A. In that profile, output current rises as temperature increases up to a particular value at which the output current is at its peak. As temperature rises beyond the particular value, the output current declines. Accordingly, designing adaptive current mirror 902 to have such a current vs. temperature profile may result in the circuit operating as a bias current circuit that compensates for rising temperature below the value at which output current peaks. At values above the temperature at which current peaks, adaptive current mirror 902 reduces the bias current provided to ring oscillator 905, thereby reducing its frequency and thus performing a thermal control action with no outside intervention (e.g., from a temperature or metrology control system).

Figure 10:
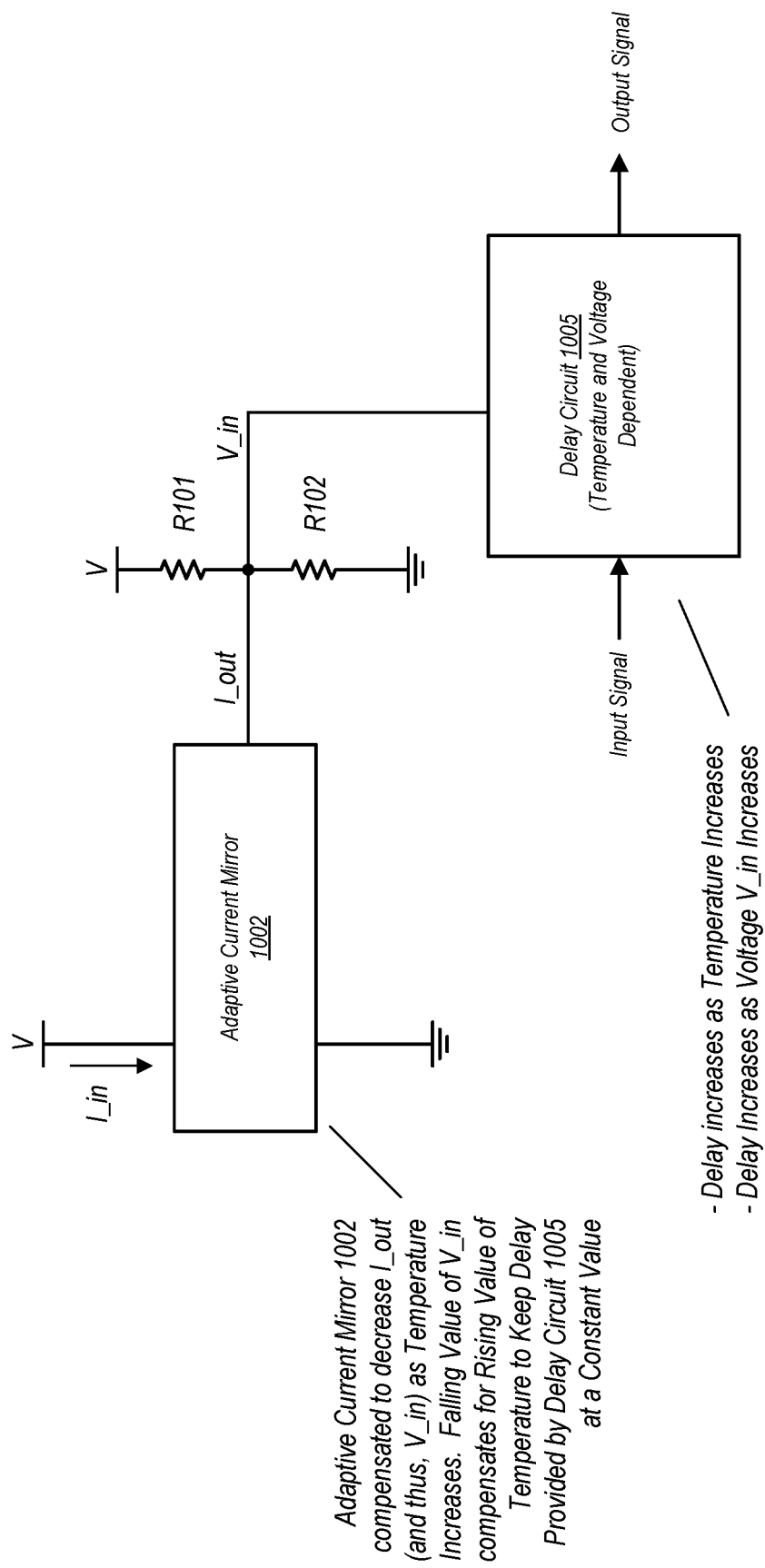
FIG. 10 is a diagram of a delay circuit utilizing an adaptive current mirror to compensate for temperature effects.

FIG. 10 illustrates another example in which an adaptive current mirror in accordance with the disclosure is used to provide compensation to a delay circuit to mitigate, if not eliminate the effects of temperature on the delay provided by the delay circuit.

In the illustrated example, delay circuit 1005 is coupled to receive an input signal and is configured to generate an output signal that is a delayed version of the input signal. As is true for some embodiments of a delay circuit, the delay provided by delay circuit 1005 in the embodiment shown increases with temperature as well as with increases in its supply voltage. Conversely, when the temperature and voltage fall, the delay also falls correspondingly. Accordingly, adaptive current mirror 1002 in this example causes the supply voltage provided to delay circuit to be used as compensation for the variations in temperature.

Adaptive current mirror 1002 in the example shown is configured to produce an output current, I_out, based on an input current I_in. The output current I_out is converted into a voltage, V_in, by a resistive voltage divider including resistors R101 and R102. The voltage V_in is provided as a supply voltage to delay circuit 1005. To compensate for the effects of rising temperature, adaptive current mirror 1002 may be implemented with a current vs. temperature profile similar to that of I2 in FIG. 7A. In such a provide, the current is inversely proportional to the temperature, and thus decreases as temperature increases. In the illustrated example, a decrease in the output current, I_out results in a corresponding decrease in the voltage V_in used as a supply voltage for delay circuit 1005. Accordingly, the falling voltage can be used to compensate for rising temperature in such a manner as to keep the delay applied by delay circuit 1005 at a substantially constant value. Similarly, a falling temperature may result in a rise in the supply voltage to delay circuit 1005 (as I_out falls), and thus delay may be held substantially constant as temperature falls.

The various example use cases of an adaptive current mirror as disclosed herein are meant to be illustrative, but are not limiting in any manner. On the contrary, the scope of the disclosure is intended to cover the adaptive current mirror as described herein in virtually any type of application where the output current varies as a function of temperature in a controlled manner and in accordance with the various possible current vs. temperature profiles.

Figure 11:
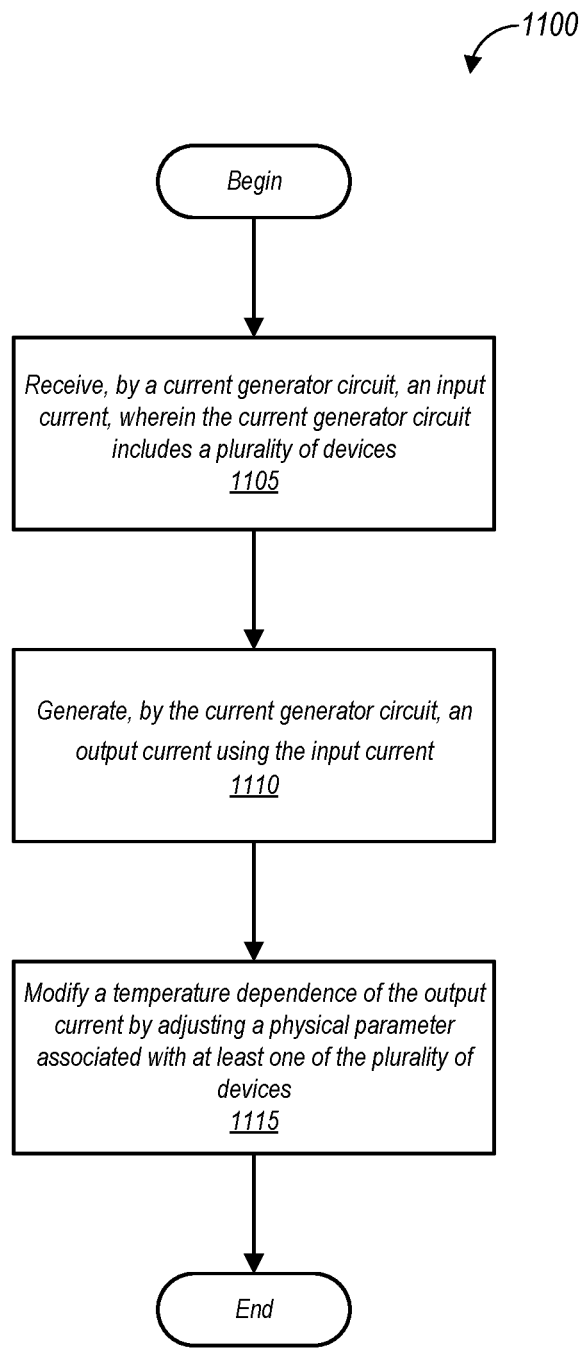
FIG. 11 is a flow diagram of one embodiment of a method for operating an adaptive current mirror circuit.

Method Flow Diagram:

FIG. 11 is a flow diagram of one embodiment of a method for operating an adaptive current mirror circuit. Method 1100 as shown in FIG. 11 may be carried out by any embodiment of an adaptive current mirror circuit discussed herein. Embodiments of an adaptive current mirror circuit capable of carrying out Method 800 but not explicitly disclosed herein are nevertheless considered to fall within the scope of this disclosure.

Method 1100 includes receiving, by a current generator circuit, an input current, wherein the current generator circuit includes a plurality of devices (block 1105). The method further includes generating, by the current generator circuit, an output current using the input current (block 1110). Thereafter, the method includes modifying a temperature dependence of the output current by adjusting a physical parameter associated with at least one of the plurality of devices (block 1115).

In various embodiments, modifying the temperature dependence of the output current includes causing the output current to increase linearly as temperature increases. In other embodiments, modifying the temperature dependence of the output current includes causing the output current to decrease linearly as temperature increases. Further embodiments are contemplated wherein modifying the temperature dependence of the output current includes causing the output current to increase a temperature increases up to a particular temperature and to decrease as temperature increases above the particular temperature.

Embodiments of the method generate more complex current vs. temperature profiles are also possible and contemplated. In one such embodiment, the method includes causing the output current to increase as temperature increases up to a first temperature value. The embodiment further includes causing the output current to remain steady in a range of temperatures between the first temperature value and a second temperature value, the second temperature value being greater than the first temperature value, and causing the output current to increase as temperature increases above the second temperature value.

In various embodiments, the method includes generating, using the input current, a voltage level on a control node of an output device of the current generator circuit and sinking an adjustment current from the control node, wherein a value of the adjustment current is based on the temperature. Embodiments of the method also include generating the output current, in the current generator circuit, using an overdrive voltage and modifying the temperature dependence, using a compensation circuit, by adjusting a value of the overdrive voltage based on temperature.

EXAMPLE SYSTEM

Figure 12:
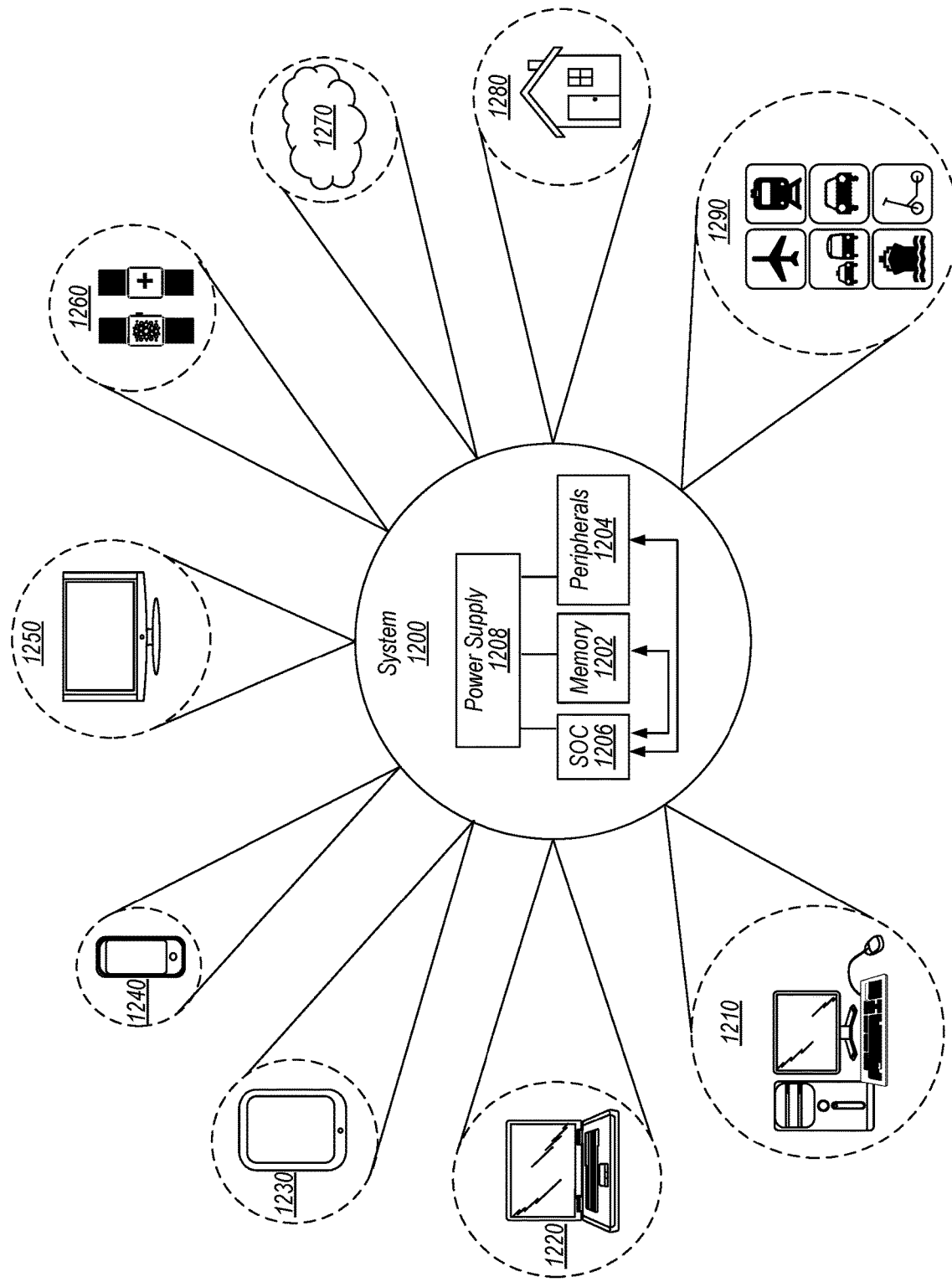
FIG. 12 is a block diagram of one embodiment of an example system.

Turning next to FIG. 12, a block diagram of one embodiment of a system 1200 is shown that may incorporate and/or otherwise utilize the methods and mechanisms described herein. In the illustrated embodiment, the system 1200 includes at least one instance of a system on chip (SoC) 1206 which may include multiple types of processing units, such as a central processing unit (CPU), a graphics processing unit (GPU), or otherwise, a communication fabric, and interfaces to memories and input/output devices. In some embodiments, one or more processors in SoC 1206 include multiple execution lanes and an instruction issue queue. In various embodiments, SoC 1206 is coupled to external memory 1202, peripherals 1204, and power supply 1208.

A power supply 1208 is also provided which supplies the supply voltages to SoC 1206 as well as one or more supply voltages to the memory 1202 and/or the peripherals 1204. In various embodiments, power supply 1208 represents a battery (e.g., a rechargeable battery in a smart phone, laptop or tablet computer, or other device). In some embodiments, more than one instance of SoC 1206 is included (and more than one external memory 1202 is included as well).

The memory 1202 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 1204 include any desired circuitry, depending on the type of system 1200. For example, in one embodiment, peripherals 1204 includes devices for various types of wireless communication, such as Wi-Fi, Bluetooth, cellular, global positioning system, etc. In some embodiments, the peripherals 1204 also include additional storage, including RAM storage, solid state storage, or disk storage. The peripherals 1204 include user interface devices such as a display screen, including touch display screens or multi-touch display screens, keyboard or other input devices, microphones, speakers, etc.

As illustrated, system 1200 is shown to have application in a wide range of areas. For example, system 1200 may be utilized as part of the chips, circuitry, components, etc., of a desktop computer 1210, laptop computer 1220, tablet computer 1230, cellular or mobile phone 1240, or television 1250 (or set-top box coupled to a television). Also illustrated is a smartwatch and health monitoring device 1260. In some embodiments, smartwatch 1260 may include a variety of general-purpose computing related functions. For example, a smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 1200 may further be used as part of a cloud-based service(s) 1270. For example, the previously mentioned devices, and/or other devices, may access computing resources in the cloud (i.e., remotely located hardware and/or software resources). Still further, system 1200 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 12 is the application of system 1200 to various modes of transportation. For example, system 1200 may be used in the control and/or entertainment systems of aircraft, trains, buses, cars for hire, private automobiles, waterborne vessels from private boats to cruise liners, scooters (for rent or owned), and so on. In various cases, system 1200 may be used to provide automated guidance (e.g., self-driving vehicles), general systems control, and otherwise. These any many other embodiments are possible and are contemplated. It is noted that the devices and applications illustrated in FIG. 12 are illustrative only and are not intended to be limiting. Other devices are possible and are contemplated.

Various embodiments of the system of FIG. 12 may utilize one or more instances of the adaptive current mirror circuit disclosed herein. The applications for which the instances of the adaptive current mirror may vary. Similarly, the order of the particular instances of the adaptive current mirror may vary from one instance to the next. The profile of current vs. temperature can also vary, and may correspond to one of the profiles illustrated in FIG. 7A.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a current generator circuit configured to:
      receive an input current; and
      generate an output current using the input current and an overdrive voltage, wherein the current generator circuit includes a current mirror circuit configured to receive the input current and further configured to generate the output current based on the overdrive voltage; and
   a compensation circuit configured to adjust a value of the overdrive voltage based on temperature, wherein the compensation circuit is configured to adjust a conductance of an output device of the current mirror circuit by adjusting the overdrive voltage.

2. The apparatus of claim 1, wherein the current mirror circuit includes an input device coupled to receive the input current and the output device configured to provide the output current, and wherein the compensation circuit includes at least one device pair coupled to the input device, wherein the input device is a diode-coupled device.

3. The apparatus of claim 2, wherein the at least one device pair includes:
   a first device having a respective gate terminal coupled to a gate terminal of the input device; and
   a second device having respective gate and drain terminals coupled to a source terminal of the input device.

4. The apparatus of claim 2, wherein the compensation circuit includes a plurality of device pairs coupled to the input device, wherein ones of the plurality of device pairs include:
   a first device having a respective gate terminal coupled to a gate terminal of the input device; and
   a second device having respective gate and drain terminals coupled to a source terminal of the input device.

5. The apparatus of claim 1, wherein the compensation circuit is configured to adjust the overdrive voltage to cause the output current to increase linearly with temperature.

6. The apparatus of claim 1, wherein the compensation circuit is configured to cause the output current to decrease linearly with temperature.

7. The apparatus of claim 1, wherein the compensation circuit is configured to cause the output current to increase with temperature when a temperature is below a particular temperature value, and to decrease when the temperature is above the particular temperature value.

8. A method comprising:
receiving, by a current mirror circuit of a current generator circuit, an input current, wherein the current generator circuit includes a plurality of devices;
generating, by the current mirror circuit and using an overdrive voltage, an output current using the input current; and
modifying a temperature dependence of the output current, using a compensation circuit, by adjusting a value of the overdrive voltage based on temperature, wherein said modifying includes the compensation circuit adjusting a conductance of an output device of the current mirror circuit using the overdrive voltage.

9. The method of claim 8, wherein modifying the temperature dependence of the output current includes causing the output current to increase linearly as temperature increases.

10. The method of claim 8, wherein modifying the temperature dependence of the output current includes causing the output current to decrease linearly as temperature increases.

11. The method of claim 8, wherein modifying the temperature dependence of the output current includes causing the output current to increase a temperature increases up to a particular temperature and to decrease as temperature increases above the particular temperature.

12. The method of claim 8, wherein modifying the temperature dependence includes:
causing the output current to increase as temperature increases up to a first temperature value;
causing the output current to remain steady in a range of temperatures between the first temperature value and a second temperature value, the second temperature value being greater than the first temperature value; and
causing the output current to increase as temperature increases above the second temperature value.

13. The method of claim 8, further comprising the compensation circuit causing an increase of the overdrive voltage as temperature increases.

14. The method of claim 8, further comprising the compensation circuit causing a decrease of the overdrive voltage as temperature increases.

15. The method of claim 8, further comprising the compensation circuit maintaining the output current at a constant value as temperature changes.

16. A system comprising:
a temperature sensor circuit, wherein the temperature sensor circuit includes:
a first current mirror circuit configured to receive a first input current and configured to generate a first output current based on a first overdrive voltage;
a first compensation circuit configured to adjust a value of the first overdrive voltage based on temperature, wherein the first compensation circuit is configured to adjust a conductance of an output device of the first current mirror circuit by adjusting the first overdrive voltage; and
an output circuit configured to, using the first output current, generate one or more output signals indicative of a temperature of the temperature sensor circuit.

17. The system of claim 16, wherein the first compensation circuit is configured to cause the first output current to increase as temperature increases.

18. The system of claim 17, further comprising:
a second current mirror circuit configured to receive a second input current and further configured to generate a second output current based on a second overdrive voltage;
a second compensation circuit configured to adjust maintain the overdrive voltage at a steady value over a range of temperatures.

19. The system of claim 18, further comprising:
a first voltage divider circuit configured to generate an input voltage using the first output current;
a second voltage divider circuit configured to generate a reference voltage using the second output current; and
a resistor ladder configured to generate a plurality of comparison voltages using the reference voltage.

20. The system of claim 19, further comprising a plurality of comparators configured to compare the reference voltage and respectively received ones of the plurality of comparison voltages to generate a corresponding plurality of comparison results.

21. The system of claim 20, wherein the output circuit comprises an encoder configured to generate a digital value based on the plurality of comparison results.

* * * * *